United States Patent [19]

Smith

[11] Patent Number: 4,890,689

[45] Date of Patent: Jan. 2, 1990

[54] OMNIDIRECTIONAL SPEAKER SYSTEM

[75] Inventor: Stephen H. Smith, Solana Beach, Calif.

[73] Assignee: TBH Productions, Inc., La Costa, Calif.

[21] Appl. No.: 132,908

[22] Filed: Dec. 14, 1987

Related U.S. Application Data

[63] Continuation-in-part of Ser. No. 869,359, Jun. 2, 1986, abandoned.

[51] Int. Cl.[4] .............................................. H05K 5/00

[52] U.S. Cl. .................................... 181/144; 181/147; 181/150; 181/152; 181/153; 181/199

[58] Field of Search ............... 181/144, 150, 153, 158, 181/199, 145–147, 152, 159, 192, 177, 195; 381/90, 156

[56] References Cited

U.S. PATENT DOCUMENTS

| | | | |
|---|---|---|---|
| 797,725 | 8/1905 | Eichhorn | 181/192 |
| 1,683,879 | 9/1928 | Ewald | 181/192 |
| 3,477,540 | 11/1969 | Rizo-Patron | 181/144 X |
| 3,976,838 | 8/1976 | Stallings, Jr. | 381/90 |
| 4,016,953 | 4/1977 | Butler | 181/144 X |
| 4,231,446 | 11/1980 | Weiss et al. | 181/148 |
| 4,280,586 | 7/1981 | Peterson | 181/150 |
| 4,466,505 | 8/1984 | Ritter | 181/144 |
| 4,503,553 | 3/1985 | Davis | 381/24 |
| 4,625,828 | 12/1986 | Shivashankara et al. | 181/175 |
| 4,673,057 | 6/1987 | Glassco | 181/144 |

FOREIGN PATENT DOCUMENTS 836862 4/1952 Fed. Rep. of Germany .

*Primary Examiner*—B. R. Fuller

*Attorney, Agent, or Firm*—Baker, Maxham, Jester & Meador

[57] ABSTRACT

An omnidirectional speaker unit includes a housing having a plurality of twelve identical sides each having a speaker mounted therein and equally spaced around and directed outward from a common point with all speakers connected to operate in unison to provide a spherical dispersal of sound. A preferred embodiment of the invention is the intersection of six equi-distant identical hyperboloids of two sheets creating horns that merge at unique saddle-like curves between adjacent horns of the enclosure with each speaker placed at the end of a long hyperboloid horn.

11 Claims, 1 Drawing Sheet

OMNIDIRECTIONAL SPEAKER SYSTEM

REFERENCE TO RELATED APPLICATIONS

This application is a continuation-in-part of co-pending application Ser. No. 869,359, filed June 2, 1986, abandoned and entitled "Omnidirectional Speaker System".

BACKGROUND OF THE INVENTION

The present invention relates to sound transducers and pertains particularly to an improved speaker unit.

The speakers of any musical system are very critical to the faithful reproduction of the music generated, whether from a live performance or from sound recordings. Present speaker systems that are widely used fall into two general types. These are the ducted port type and the acoustic system.

The ducted port type consists of an acoustic transducer, with one side exposed at an opening in an enclosure, with the other side directed through a duct internally that leads to a hole or opening in the enclosure. This type of speaker uses the resistance of the air movement through the ducted port, as well as its spring-like action to effect an impedance match between a transducer cone or diaphragm and the air. This type of impedance match works in a narrow band of frequencies for low audio frequencies or base tones. These types, however, require large heavy enclosures.

The acoustic suspension type comprises an acoustic transducer, with one side exposed at an opening, but with the other side sealed airtight in an enclosure. This type system provides a much wider and flatter frequency range but suffers from low efficiency. This system uses a sealed airtight enclosure in which the moving speaker cone or diaphragm alternately raises and lowers the internal pressure to provide a relatively constant reactive load. The efficiency of this type of speaker is low because no impedance matching means is placed between the relatively low impedance cone or diaphragm and the high impedance of the air.

Both of the above described systems provide an acoustic energy essentially from a single or in some cases from two sides of an enclosure. An analysis of the acoustic field pattern of these systems, when plotted, usually shows a sound intensity profile, which originates at the speaker cone or diaphragm, and spreads outward from one or maybe two directions, decreasing in intensity from the speaker cone. Difficulties are encountered when these systems are utilized in areas or enclosures where there are solid objects. Sounds with varying harmonic content can take various paths or multiple paths and arrive at locations out of phase, thereby cancelling and causing dead spots or distortion.

In our aforementioned application, an omnidirectional speaker array was disclosed which greatly improves the sound distribution within a listening area. This concept was also disclosed in U.S. Pat. No. 4,673,057, issued June 16, 1987 to Glassco, and licensed exclusively to the assignee hereof. These speakers, while improving the sound distribution, fail to provide optimum efficiency.

It is, therefore, desirable that an improved speaker system be available.

SUMMARY AND OBJECTS OF THE INVENTION

It is the primary object of the present invention to provide an improved audio system.

In accordance with the primary aspect of the present invention, a speaker system comprises an omnidirectional array speaker mounted in a sealed enclosure formed of horns of intersecting hyperboloids of two sheets, and directed outwardly from a common point at equal angles to one another.

BRIEF DESCRIPTION OF THE DRAWING

The above and other objects and advantages of the present invention will become apparent from the following description when read in conjunction with the drawings wherein.

DETAILED DESCRIPTION OF PREFERRED EMBODIMENTS

Figure 1:
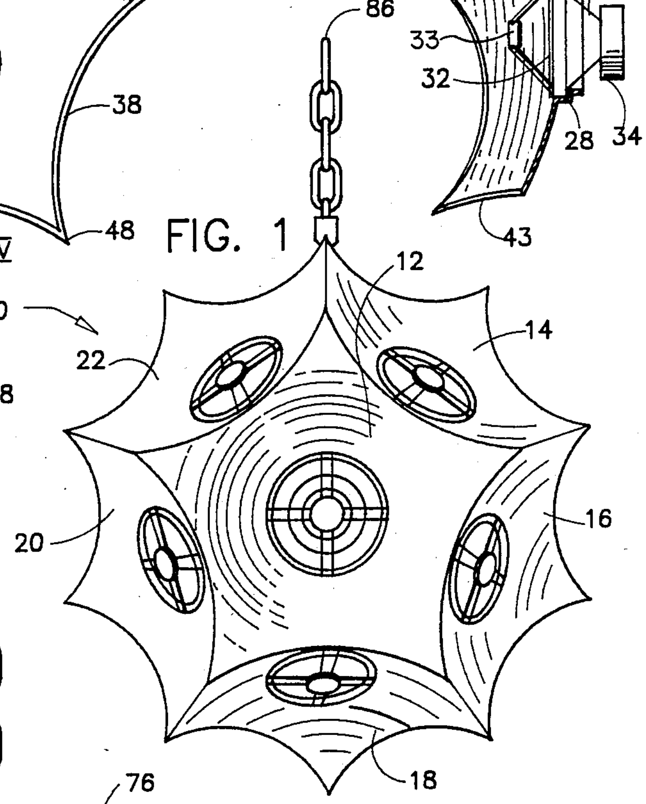
FIG. 1 is a front elevation view of a speaker of the speaker system.

Referring to FIG. 1 of the drawings, a speaker system or unit in accordance with the invention is illustrated and designated generally by the numeral 10. The illustrated embodiment comprises a speaker system that combines a plurality of axially aligned sets or pairs of transducers, with an enclosure to achieve a wide band width and high frequency along with omnidirectional output. The pairs of transducers are geometrically arranged co-axially within hyperboloids of two sheets. Each speaker is placed at the end of a long hyperboloid horn. The system, as illustrated in FIG. 1, takes the shape of a dodecahedron with twelve hyperboloid horns forming the faces, with the plurality of speakers forming an omnidirectional array. Each of the twelve hyperboloid shaped faces contains a transducer or speaker mounted directly at its end and directed outward from the face. In the preferred arrangement, the low frequency speaker is mounted at the apex of the hyperboloid surface, and the tweeter is mounted at the focal point of the hyperboloid.

The system is closed with the housing sealed just as in the acoustic type of suspension system previously described. The twelve transducers or speakers of the system are electrically connected so that they are all in phase. The effect of this connection is that all cones or diaphragms move either inwardly or outwardly together, causing an increased or decreased internal pressure within the housing or enclosure, creating in effect a single speaker unit having a spherical sound distribution.

This provides a system that has some of the properties of the acoustic suspension system in that it exhibits a very flat frequency response, with a very high efficiency compared to the acoustic suspension system. The high efficiency is due to the inherent dynamic impedance, matching that comes from the use of the pressure waves of the five adjacent transducers around each transducer to form a five-sided pressure wall, which expands exponentially away from the surface of the dodecahedron. Additional efficiency is achieved by the hyperboloid faces or horns within which the transducers are each mounted.

This basic configuration provides an almost infinite baffle or matching horn. The curved shape of the speaker cone is extended to intersect adjacent horns by a raised edge around the hyperboloid pentagon faces. This forms a point at the intersection of adjacent faces to eliminate turbulence between the adjacent speakers and forms an almost infinite extension of the hyperboloid horn by the pressure wave from adjacent horns.

The illustrated twelve speaker array provides a unit that sufficiently conforms to the desired hyperboloid configuration to achieve high efficiency in sound reproduction. However, a more accurate conformance can be achieved by increasing the number of speakers up to thirty.

Figure 6:
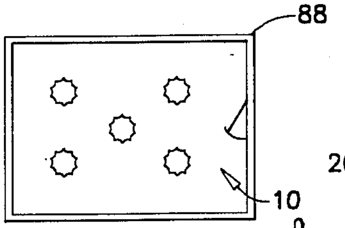
FIG. 6 is a schematic illustration of a system in accordance with the invention in a room.

The enclosed omnidirectional system is in effect an acoustic sphere, which is changing in volume at the applied audio voltage rate. The sound radiating from this sphere is truly omnidirectional and causes an acoustic pressure change rather than a directed sound. This is particularly true within an enclosure, such as a room 88 or an auditorium for example. One or more units in a room 88, as shown in FIG. 6, gives the impression of filling the room with music or sound. Cancelling and distortion, which is a problem of the prior art systems, is essentially eliminated by this system, either with a single or multiple unit.

Figure 2:
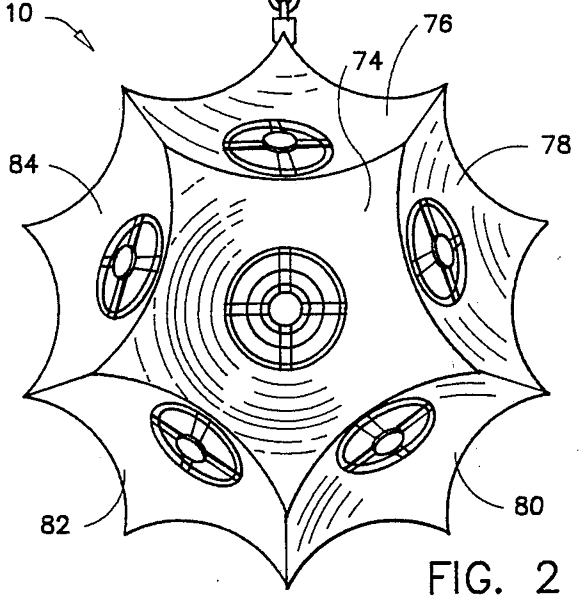
FIG. 2 is a front elevation view of the speaker system.

Referring specifically to FIG. 1 of the drawings, the speaker system comprises a plurality of transducer units, designated generally by the numerals 12 through 22, on what is designated the front. The overall geometric configuration of the unit is difficult to visualize from an illustration on a sheet of paper, but the directly opposite side from FIG. 1 will appear identical to the view in FIG. 1, but rotated 36 degrees about the axis of the speaker unit 12 and as shown by its oppositely position counterpart 74, as shown in FIG. 2. As can be seen from FIGS. 1 and 2, the speaker horns or peripheral extensions of the speakers of FIG. 4, 14–22 have co-axially counterparts 76, 78, 80, 82 and 84 offset by one-half of the angle covered by each of the speakers with the unit suspended as shown from a chain or the like 86. These surfaces 12–22 and 74–84 are all formed of hyperboloid configuration, with each face properly configured and axially spaced from its counterpart. The surface geometry is defined by the hyperboloid formula:

$$\frac{z^2}{c^2} - \frac{x^2}{a^2} - \frac{y^2}{b^2} = 1.$$

The pressure waves from adjacent create and form a continuation of these hyperboloid horns or cones extending out into space.

As can be appreciated from the illustration (FIGS. 1 and 2), all speakers extend or are directed radially outward from a common point along axes that are at equal angles to one another. The speakers, therefore, radiate radially outward from a common center point of a sphere, for example. The speaker pairs are spaced along a common axis.

Figure 3:
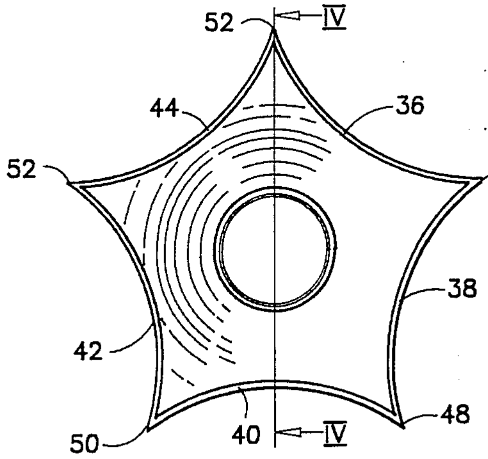
FIG. 3 is a side elevation view in section of a single speaker unit taken generally on line III—III of FIG. 1.
Figure 4:
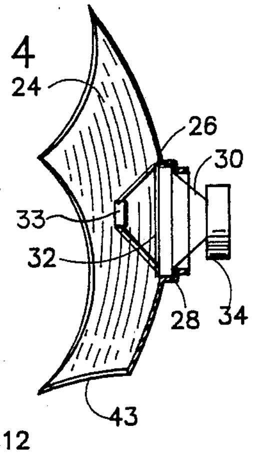
FIG. 4 is a view like FIG. 2 of the opposite side of the speaker system.

With reference to the drawings, particularly to FIGS. 1, 3 and 4, one of the transducer units will be described, with it to be understood that they are identical. The transducer to be described will be that of numeral 12 which, as can be seen, comprises a generally pentagon shaped hyperboloid dish 24 having a circular aperture 26 disposed in the very center thereof. The dish 24 has a hyperboloid configuration, and may have a different degree of extension (i.e. length), but preferably extends out to merge with an adjacent cone at a very low angle. Each of the dishes have a mounting rim or flange 28 within or encircling the center opening or aperture of 26 for receiving the edge of a speaker unit, as shown in FIG. 4.

The speaker unit comprises an outer frame or support frame 30, with a diaphragm or cone 32 extending across the face thereof. The diaphragm for the base is positioned at the back wall of the hyperboloid dish and connected in the usual manner to voice coils, which are contained within and surrounded by a magnet 34. This is a substantially conventional construction of a speaker, and the speaker is selected and the entire enclosure sized and conformed to the power and characteristics of the speaker itself. The tweeter 33 is positioned forward of the base at the focal point of the hyperboloid dish or horn so that the sound from the tweeter is reflected over the entire surface of the hyperboloid. Each tweeter will then reflect its energy evenly throughout 1/12 part of total space.

The hyperboloid dish 24 (FIGS. 3 and 4) may be constructed of any suitable material, such as a hard plastic, metal or other suitable material. The hyperboloid dish 24 forms an extension (hyperboloid) of the speaker cone as will be subsequently explained.

The pentagon shaped dishes are of a somewhat thin, rigid structure in the illustrated embodiment (FIGS. 3 and 4), and each is formed of a hyperboloid pentagon configuration, having scalloped shaped sides 36, 38, 40, 42 and 44 joining like scalloped or shaped sides of adjacent speaker units so that they converge or merge smoothly into the adjacent horn, preferably at a small angle of less than about fifteen degrees. This shape and construction provides an improved impedance match of the speaker on into the atmosphere.

Each of these scalloped sides includes a flange, as seen in FIGS. 3 and 4, extending slightly outward to provide a mating surface for adjacent dishes. The dish edges form points 46, 48, 50, 52 and 54, which serve to accommodate the extension of the dish or horn function thereof and also reduce turbulence between adjacent speakers.

The combination of units, as illustrated in FIG. 4, make up the entire system, as shown in FIGS. 1 and 2, and essentially form the housing or enclosure in which the speaker or transducer units are each mounted. The enclosure, as pointed out above, which is sealed such that the speaker transducers are working in unison, compresses the air therein in-phase while in operation. The size of the enclosure (hyperboloid) is determined mainly by the size and electro-mechanical specifications of the transducers or speakers. The minimum internal volume of the enclosure is determined by the electrical power to mechanical force conversion of the speakers. The speakers must be able to compress the air inside the enclosure up to the limit of cone travel, while staying within their electric power limit and linearity. The speakers act like piston compressing air within a closed cylinder.

Figure 5:
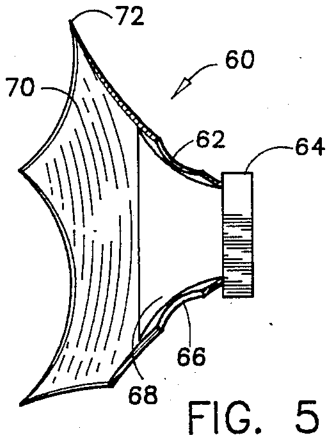
FIG. 5 is a section view like FIG. 3 of an alternate embodiment of a single speaker unit.

Referring to FIG. 5, a slightly modified version is illustrated, designated generally by the numeral 16, and is constructed such that the dish 62 forms an extension of the support structure of the magnet 64, which is connected in the usual manner to the cone or diaphragm 66, which is then mounted or sealed within the dish 62 at 68. The outer edge of the dish 62 is formed in a similar fashion to that of the previous embodiment, having scalloped edges and points 70 and 72, respectively. This construction, together with the hyperboloid figuration, is found to provide a slightly more efficient and more matched unit than prior known constructions.

The speaker panels 24 may be formed of any number of suitable materials, including metals and plastics. Certain plastics are desirable in that they lend themselves to vacuum forming.

Among the advantages of the present system is that of having the widest possible frequency response getting the low frequency up as soon as possible, and staying flat over the whole frequency range. This phased array system creates and extends the hyperboloid cones by the pressure wave from adjacent speakers.

While I have illustrated and described my invention by means of specific embodiments, it is to be understood that numerous changes and modifications may be made therein without departing from the spirit or scope of the invention as defined in the impending claims.

I claim:

1. A system of speakers comprising:

an enclosed housing defined by a plurality of intersecting horns having a hyperboloid configuration and equally spaced around and from one another in an omnidirectional array and directed outward from a common point; and wherein each of said horns has an apex and a focal point, a transducer of a first frequency mounted at the apex thereof, and a transducer of a higher frequency mounted at the focal point thereof.

2. A system according to claim 1 wherein:

said transducers are at least twelve in number.

3. A system according to claim 1, wherein:

said transducers are sealed in said housing.

4. A system according to claim 1, wherein:

each horn comprises a hyperboloid extension intersecting adjacent extensions by means of curved edges thereof.

5. A system according to claim 1 wherein:

each of said horns is defined by a housing wall that extends to and merges with a wall of an adjacent horn at an angle of less than about 15 degrees at a curved edge.

6. An omnidirectional speaker system comprising:

a support housing having wall means defining a sealed enclosure having a plurality of identical horns of a hyperboloid configuration forming an omnidirectional array equally spaced around and from one another and directed outward from a common point;

a plurality of transducers comprising a first transducer of a first frequency sealed in said housing in each of said horns, and a second transducer mounted at a focal point of each of said horns; and said housing has a volume relative to said transducers for maintaining a linearity of said transducers during an operation thereof in unison.

7. A system according to claim 6 wherein:

said transducers are at least twelve in number.

8. A system according to claim 6, wherein:

each horn defines a hyperboloid horn extension thereof intersecting adjacent horns along a curved edge extending to a point intersection of a plurality of said edges.

9. An omnidirectional hyperboloid speaker system comprising:

a support housing having wall means defining a sealed enclosure having a plurality of identical sides defined by a plurality of horns of a hyperboloid configuration equally spaced around and from one another and directed outward from a common point; and a first plurality of transducers, each sealingly mounted at an inner end of one of said horns;

a second plurality of transducers, each mounted coaxially of one of said horns at a focal point thereof; and said speakers are connected to work in unison.

10. A system according to claim 9, wherein:

said housing has a generally dodecahedron configuration and is sized to have a compressible volume of gas therein for maintaining a linearity of said transducers over a normal range of operation thereof.

11. A system according to claim 9, wherein:

said horns each interaecting adjacent horns along a curved edge extending to a point intersection of a plurality of said edges.

* * * * *